United States Patent
Matsudai et al.

(10) Patent No.: US 6,664,591 B2
(45) Date of Patent: Dec. 16, 2003

(54) INSULATED GATE SEMICONDUCTOR DEVICE

(75) Inventors: Tomoko Matsudai, Tokyo (JP); Akio Nakagawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/268,997

(22) Filed: Oct. 11, 2002

(65) Prior Publication Data

US 2003/0071305 A1 Apr. 17, 2003

(30) Foreign Application Priority Data

Oct. 15, 2001 (JP) ........................................ 2001-316824

(51) Int. Cl.[7] .............................................. H01L 29/76
(52) U.S. Cl. ....................................... 257/329; 257/341
(58) Field of Search ................................ 257/329, 330, 257/335, 339, 342, 341

(56) References Cited

U.S. PATENT DOCUMENTS 5,466,951 A 11/1995 Brunner et al. .............. 257/139
2003/0071305 A1 * 4/2003 Matsudai et al. ............ 257/329

FOREIGN PATENT DOCUMENTS

JP 6-318706 11/1994
JP 11-274484 10/1999

OTHER PUBLICATIONS

Tomoko Matsudai, et al., "Ultra High Switching Speed 600 V Thin Wafer PT–IGBT Based on New Turn–Off Mechanism", International Symposium on Power Semiconductor Devices & ICs '02, pp. 285–288.

Tomoko Matsudai, et al., "Advanced 60μm Thin 600V Punch–Through IGBT Concept for Extremely Low Forward Voltage and Low Turn–off Loss", Proceedings of 2001 International Symposium on Power Semiconductor Devices & ICs, Osaka, pp. 441–444.

T. Laska, et al., "The Field Stop IGBT (FS IGBT)—A New Power Device Concept with a Great Improvement Potential", ISPSD'2000, May 22–25, pp. 355–358.

* cited by examiner

Primary Examiner—Mark V. Prenty
(74) Attorney, Agent, or Firm—Oblon, Spivak, McClelland, Maier & Neustadt, P.C.

(57) ABSTRACT

An insulated gate semiconductor device includes a first base layer of a first conduction type; a second base layer of a second conduction type formed on a first surface of the first base layer; a source layer of the first conduction type selectively formed in a surface region of the second base layer; a drain layer of the second conduction type formed on a second surface of the first base layer opposite from said first surface; and a gate electrode insulated from the source layer, the first base layer and the second base layer and forming in the first base layer a channel electrically connecting between the source layer and the second base layer, wherein the injection efficiency of hole current from said drain layer is 0.27 in maximum.

20 Claims, 8 Drawing Sheets

A GRAPH OF CHANGES OF THE CURRENT-VOLTAGE
CHARACTERISTICS OF L-LOADED IGBT 30

V-I CHARACTERISTICS OF 600V IGBT
ACCORDING TO THE INSTANT EMBODIMENT

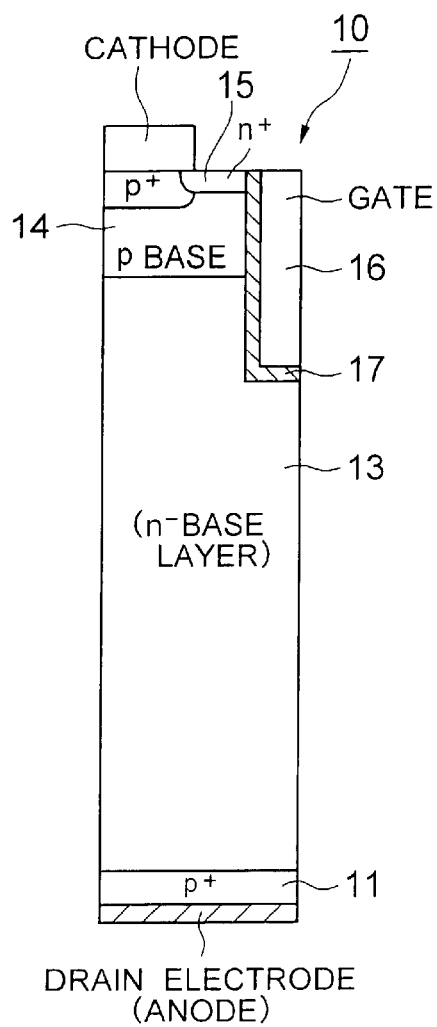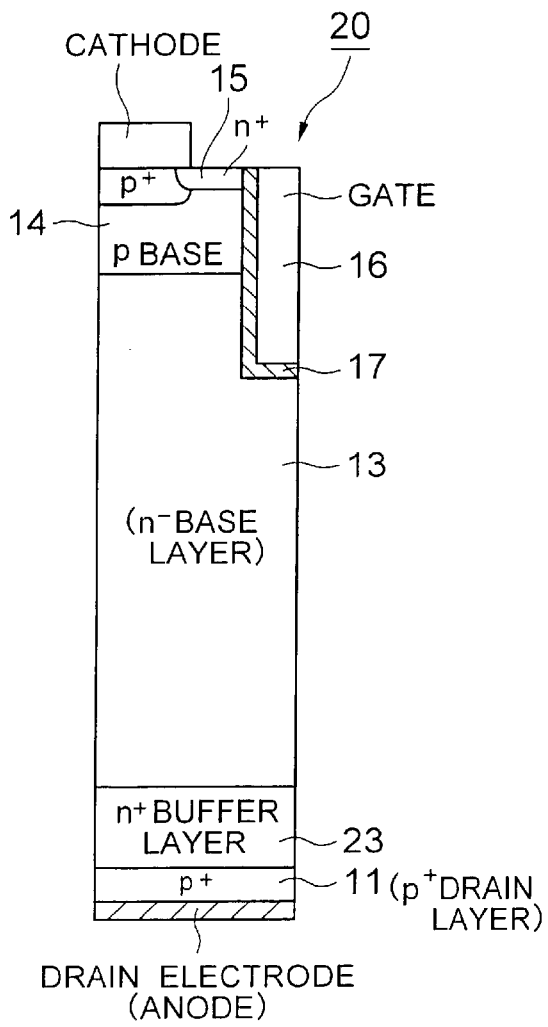
FIG. 10A
PRIOR ART
FIG. 10B
PRIOR ART

A GRAPH OF CHANGES OF THE CURRENT-VOLTAGE
CHARACTERISTICS OF L-LOADED IGBT 20

US 6,664,591 B2

INSULATED GATE SEMICONDUCTOR DEVICE

CROSS-REFERENCE TO RELATED APPLICATIONS

This application is based upon and claims the benefit of priority from the prior Japanese Patent Application No. 2001-316824, filed on Oct. 15, 2001, the entire contents of which are incorporated herein by reference.

BACKGROUND OF THE INVENTION

1. Field of the Invention

This invention relates to an insulated gate semiconductor device.

2. Related Background Art

FIG. 10A shows a partial cross-sectional view of a non-punch-through-type and vertical-type IGBT (insulated gate bipolar transistor) taken as a prior art of insulated gate semiconductor device. This IGBT 10 includes an n-type base layer 13, and a p-type base layer 14 formed on the base layer 13. The p-type base layer 14 includes an ne-type source layer (cathode) 15 formed in a selective top surface region thereof. A $p^+$-type drain layer (anode) 11 underlies the bottom surface of the base layer 13 opposite from the top surface thereof. A gate electrode 16 is formed in the base layer 13 so that the gate electrode 16 makes a channel in the p-type base layer 14 for electrical conduction between the source layer 15 and the base layer 13. The gate electrode 16 is insulated from the base layer 13, source layer 15 and p-type base layer 14 by an insulating layer 17.

In IGBT 10, the base layer 13 must be relatively thick, or relatively low in specific resistance to prevent that the depletion layer from the p-type base layer 14 reaches the anode when it is turned OFF. As a result, the tail current during turnoff period undesirably increases. Therefore, to attain a high-speed turnoff property, injection efficiency of hole current from the anode is reduced by lifetime control. Typically, lifetime control is carried out by annealing the wafer by irradiating an electron beam after completion of the wafer process.

This process of lifetime control, however, invites a decrease of the carrier concentration in the high-resistance $n^-$-type base layer 13, and thereby undesirably increases the ON voltage. If nothing is done for shortening the lifetime, the ON voltage will be maintained low, but the turnoff time will be elongated. That is, the ON voltage and the turnoff time are related to trade off relation.

FIG. 10B shows a partial cross-sectional view of a punch-through type and vertical type IGBT taken as another prior art. This IGBT 20 is different from IGBT 10 in including an $n^+$-type buffer layer 23 interposed between the $n^-$-type base layer 13 and the $p^+$-type drain layer 11.

Because of the existence of the $n^+$-type buffer layer 23, the depletion layer from the p-type base layer 14 does not reach the anode even when the $n^-$-type base layer 13 is relatively thin or has a relatively high resistance. Therefore, IGBT 20 can maintain a resistivity to voltage even if the $n^-$-type base layer 13 is thinner or lower in resistance than IGBT 10.

Additionally, injection efficiency of hole current in IGBT 20 is controlled by thickness or concentration of the $p^+$-type drain layer 11. Therefore, IGBT 20 has been improved toward higher switching speed without lifetime control.

Another type of IGBT operative at a switching speed as high as approximately 150 kHz has become known recently.

However, any of high-switching-speed IGBTs including the above-mentioned IGBT 20 suffer a tail current that increase under high temperatures. Tail current becomes switching loss, and the switching loss disturbs high-speed switching of IGBT.

FIG. 11 shows changes of current and voltage characteristics of L (inductance) loaded IGBT 20 in response to the time during turnoff period of IGBT 20. When the gate voltage $V_G$ decreases and the electron current flowing to the channel decreases, opposite-electromotive force is generated across opposite ends of the L load. The opposite-electromotive force is applied between the anode and the cathode, and the drain voltage $V_D$ rises (seethe portion from time $t_1$ to time $t_2$).

With the drain voltage $V_D$, a depletion layer (not shown) is generated from the junction between the high-resistance $n^-$-type base layer 13 and the p-type base layer 14. The depletion layer permits electrons heretofore accumulated in the high-resistance $n^-$-type base layer to be supplied to the electron current from the channel. As a result, IGBT 20 behaves to have a constant drain current $I_D$ to flow. Therefore, a substantially constant hole current flows from the $p^+$-type drain layer 11. That is, in the period from time $t_1$ to time $t_2$, the drain current ID is maintained approximately constant.

Electrons having accumulated in the $n^-$-type base layer are exhausted eventually. Accordingly, the hole current from the $p^+$-type drain layer also decreases. That is, the drain current $I_D$ gradually decreases in the period from time $t_2$ to time $t_3$.

The drain current $I_D$ flowing in the period after $t_3$ is called tail current.

As such, waste of power (shaded portion in FIG. 11) occurs in the period from time $t_1$ to time $t_3$. The waste of power is a switching loss of IGBT. Further, the waste of power due to the tail current flowing after time $t_3$ becomes large when the tail current flows for a long time even if the tail current is small.

Let the time $t_3$ be the end point of the fall time of the drain current $I_D$. The fall time of the drain current $I_D$ is the period beginning from the point of time where the drain current $I_D$ is 90% of its full value in the ON state of IGBT to the point of time where the drain current $I_D$ is 10% of the same. In FIG. 11, the period from time $t_2$ to time $t_3$ is the fall time.

Furthermore, IGBT maintains its breakdown voltage because of having the $n^+$-type buffer layer 23.

However, for attaining a higher breakdown voltage of IGBT, the $n^-$-type base layer 13 needs a larger thickness. For example, in case the IGBT 20 is an element having the breakdown voltage of 600V, that is, in case its base layer 13 is 60 μm thick, the $n^-$-type base layer 13 must be thicker to increase the breakdown voltage to 600V or more.

Therefore, there is a demand for insulated gate semiconductor devices having low switching loss during turnoff period while being capable of maintaining a lower ON resistance.

There is also a demand for insulated gate semiconductor devices having relatively higher breakdown voltage while maintaining a thin $n^-$-type base layer.

BRIEF SUMMARY OF THE INVENTION

An insulated gate semiconductor device according to an embodiment of the invention comprises: a first base layer of a first conduction type; a second base layer of a second conduction type formed on a first surface of the first base layer; a source layer of the first conduction type selectively formed in a surface region of the second base layer; a drain layer of the second conduction type formed on a second surface of the first base layer opposite from said first surface; and a gate electrode insulated from the source layer, the first base layer and the second base layer and forming in the first base layer a channel electrically connecting the source layer and the second base layer, wherein the injection efficiency of hole current from said drain layer is 0.27 in maximum.

An insulated gate semiconductor device according to a further embodiment of the invention comprises: a first base layer of a first conduction type; a second base layer of a second conduction type formed on a first surface of the first base layer;

a source layer of the first conduction type selectively formed in a surface region of the second base layer; a drain layer of the second conduction type formed on a second surface of the first base layer opposite from said first surface; and a gate electrode insulated from the source layer, the first base layer and the second base layer and forming in the first base layer a channel electrically connecting the source layer and the second base layer, wherein the voltage transiently applied to said device is larger than the static breakdown voltage between the source and the drain when a rated current is turned off under a condition, in which condition an inductance load is from 1 $\mu$H to 1 mH and said device is connected said inductance load without using a protective circuit, and wherein thickness of the first base layer is 70 $\mu$m in maximum.

An insulated gate semiconductor device according to a still further embodiment of the invention comprises: a first base layer of a first conduction type; a second base layer of a second conduction type formed on a first surface of the first base layer;

a source layer of the first conduction type selectively formed in a surface region of the second base layer; a drain layer of the second conduction type formed on a second surface of the first base layer opposite from said first surface; and a gate electrode insulated from the source layer, the first base layer and the second base layer and forming in the first base layer a channel electrically connecting the source layer and the second base layer, wherein the injection efficiency of hole current from the drain layer is less than 9/19.

An insulated gate semiconductor device according to a yet further embodiment of the invention comprises: a first base layer of a first conduction type; a second base layer of a second conduction type formed on a first surface of the first base layer;

a source layer of the first conduction type selectively formed in a surface region of the second base layer; a drain layer of the first conduction type formed on a first surface of the first base layer and having a thickness not larger than 0.5 $\mu$m; and a gate electrode insulated from the source layer, the first base layer and the second base layer and forming in the first base layer a channel electrically connecting the source layer and the second base layer, wherein the voltage transiently applied to said device is larger than the static breakdown voltage between the source and the drain when a rated current is turned off under a condition, in which condition an inductance load is from 1 $\mu$H to 1 mH and said device is connected said inductance load without using a protective circuit, and wherein thickness of the first base layer is 70 $\mu$m in maximum.

An insulated gate semiconductor device according to a yet further embodiment of the invention comprises: a first base layer of a first conduction type; a second base layer of a second conduction type formed on a first surface of the first base layer; a source layer of the first conduction type selectively formed in a surface region of the second base layer; a drain layer of the second conduction type formed on a second surface of the first base layer opposite from said first surface; and a gate electrode insulated from the source layer, the first base layer and the second base layer and forming in the first base layer a channel electrically connecting the source layer and the second base layer, wherein the total impurity dose of the drain layer is $5\times10^{13}$ cm$^2$ in maximum.

BRIEF DESCRIPTION OF THE DRAWINGS

FIG. 10A is a cross-sectional view of a prior art insulated gate semiconductor device;

FIG. 10B is a cross-sectional view of a prior art insulated gate semiconductor device.

DETAILED DESCRIPTION OF THE INVENTION

Figure 1:
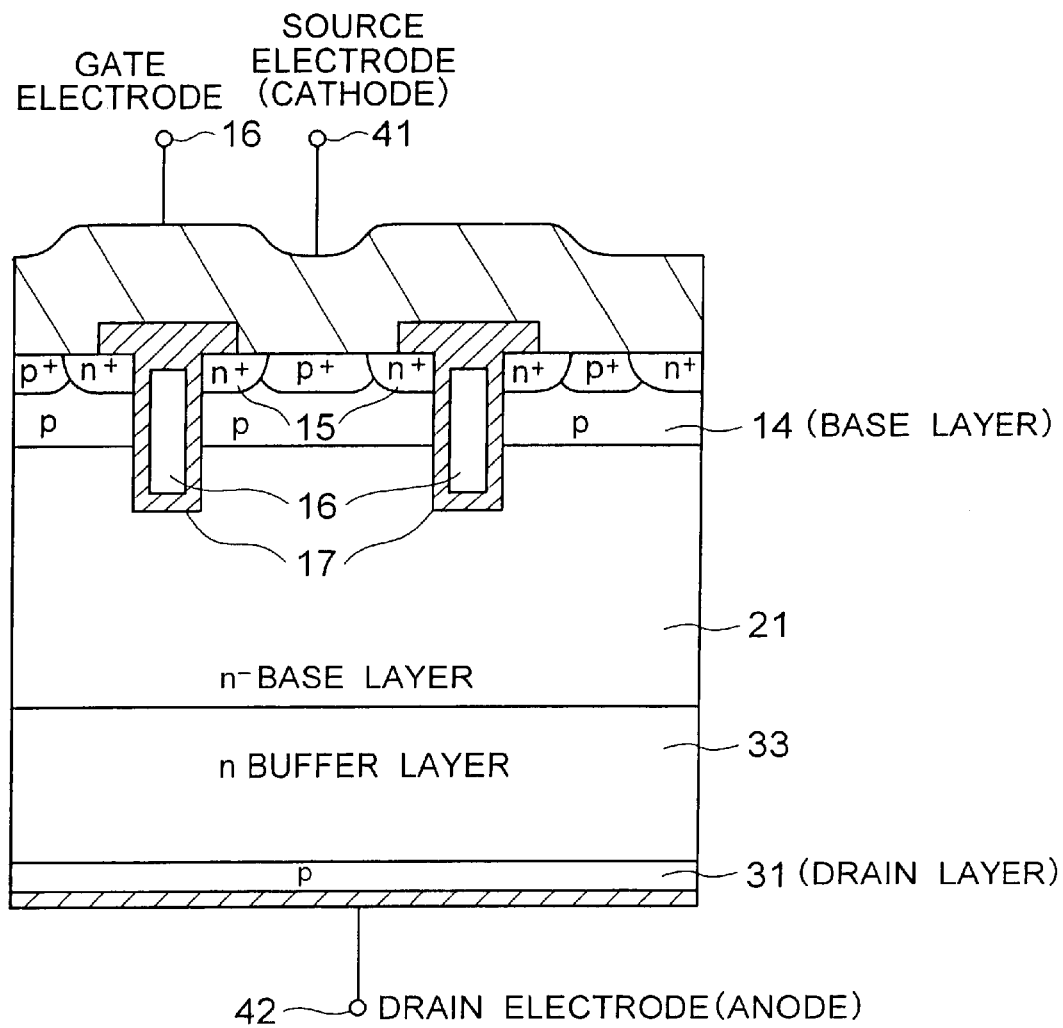
FIG. 1 is a cross-sectional view of a punch-through IGBT 30 taken as an insulated gate semiconductor device according to the first embodiment of the invention.
Figure 8:
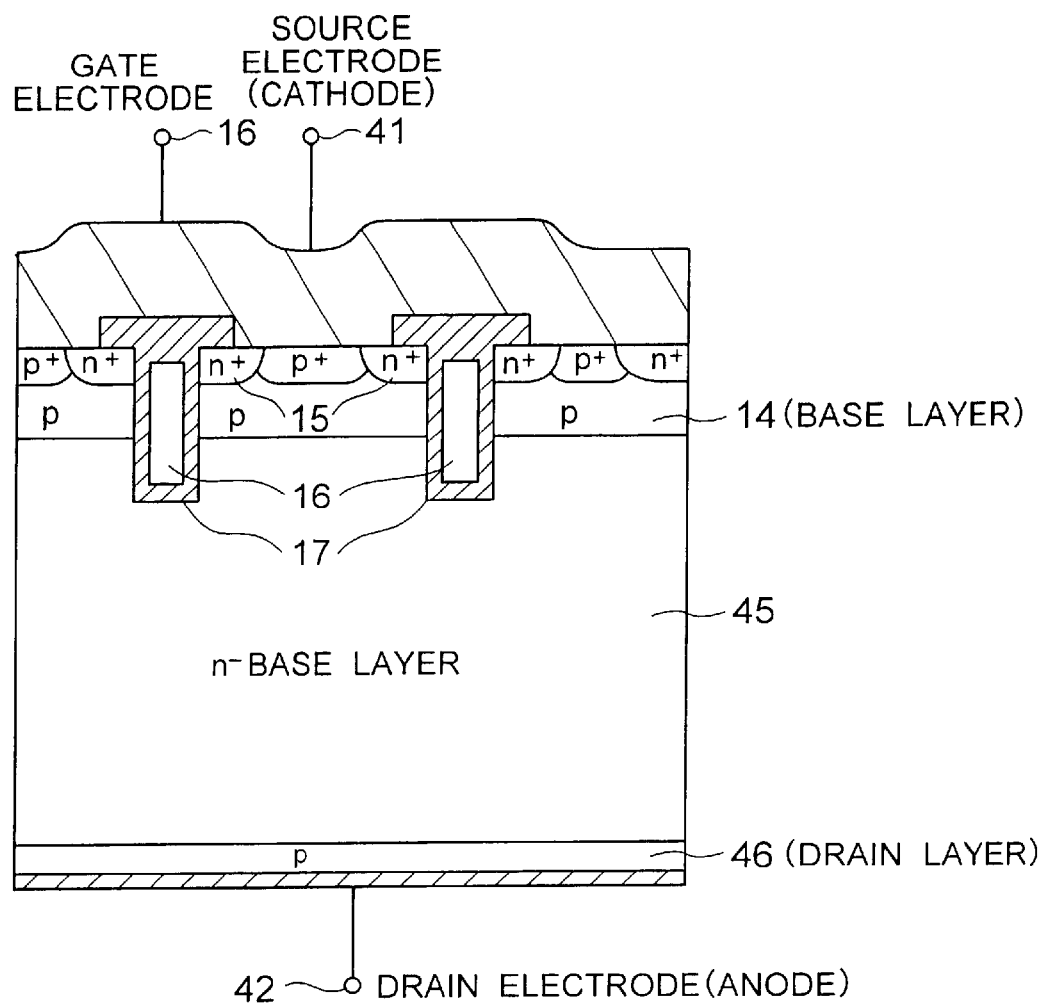
FIG. 8 is a cross-sectional view of non-punch-through IGBT 40 taken as an insulated gate semiconductor device according to the second embodiment of the invention.
Figure 9:
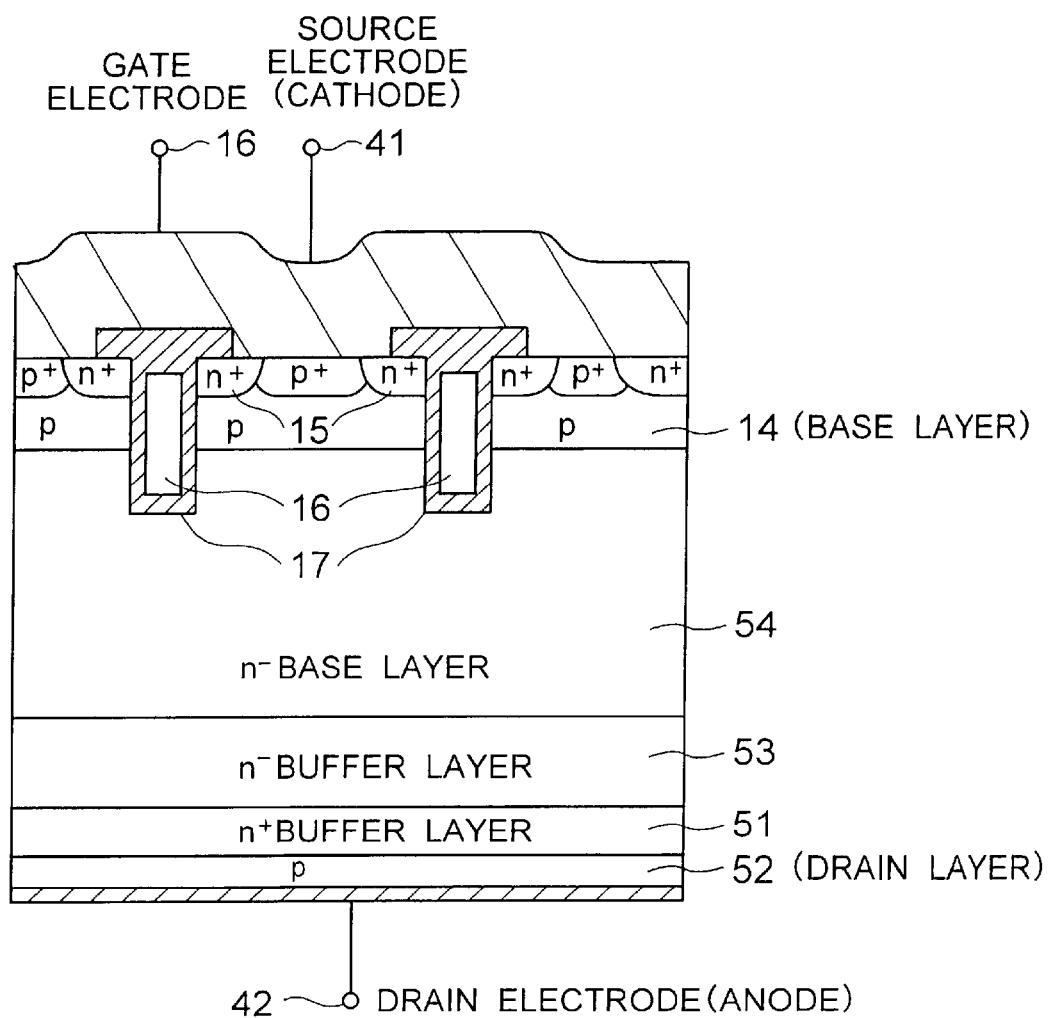
FIG. 9 is a cross-sectional view of punch-through IGBT 50 taken as an insulated gate semiconductor device according to the third embodiment of the invention.
Figure 11:
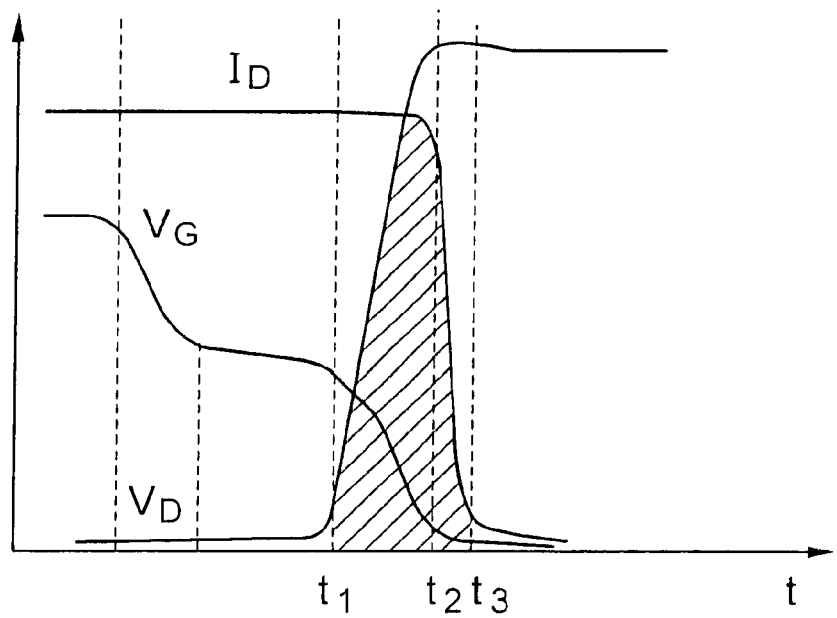
FIG. 11 is a graph shows current-voltage characteristics of prior art IGBT during turnoff period.

Some embodiments of the invention will now be explained below with reference to the drawings. In FIGS. 1, 8 and 9, the same components as those of FIG. 10 are labeled with common reference numerals.

FIG. 1 is a cross-sectional view of a punch-through IGBT 30 taken as an insulated gate semiconductor device according to the first embodiment of the invention. IGBT 30 includes an n$^-$-type base layer 21, and a p-type base layer 14 formed on the n-type base layer 21. The p-type base layer 14 includes an n$^+$-type source layer 15 formed in a selective top surface region thereof. A p-type drain layer (anode) 31 underlies the bottom surface of the n-type base layer 21 opposite from the top surface thereof A gate electrode 16 is formed in the n-type base layer 21 and in the p-type base layer 14 so as to make a channel in the p-type base layer 14 for electrical conduction between the source layer 15 and the n-type base layer 21. The gate electrode 16 is insulated from the n-type base layer 21, source layer 15 and p-type base layer 14 by an insulating layer 17. The p-type base layer 14 and the source layer 15 are connected to a source electrode 41 (cathode). The drain layer 31 is connected to a drain electrode 42.

The drain layer 31 is of a relatively low-injected and relatively low-concentrated p-type. This is effective for lowering the carrier-injection efficiency from the anode and for enhancing the switching speed operation of IGBT 30 without the lifetime control.

The omission of lifetime control contributes to increasing the carrier concentration of the high-resistance n⁻-type base layer 21. As a result, the ON-time voltage drops to around 1.2 V, for example, which is lower than voltage drop of prior art IGBTS.

This means that the trade-off relation between the enhancement of the switching speed and the low ON voltage can be improved by forming the drain layer 31 to be of a relatively low-injected and relatively low-concentrated p⁺-type.

Furthermore, the instant embodiment controls the injection efficiency of hole current from the anode to 0.27 or less. To realize it, the drain layer 31 is formed to have a total impurity dose not exceeding $5 \times 10^{13}$ cm$^{-2}$. For example, the buffer layer is controlled to have the impurity concentration of $1 \times 10^{16}$ cm$^{-3}$ and the thickness of 5 μm, and the drain layer is formed to have the thickness of 0.3 μm and a total impurity dose not exceeding $5 \times 10^{13}$ cm$^{-2}$ To limit the total impurity dose of the drain layer 31 not to exceed $5 \times 10^{13}$ cm$^{-2}$, the drain layer 31 is diffused to a thickness not larger than 0.5 μm.

The reason why the injection efficiency of hole current from the anode is controlled 0.27 or less and effects thereof will be explained below.

Figure 2:
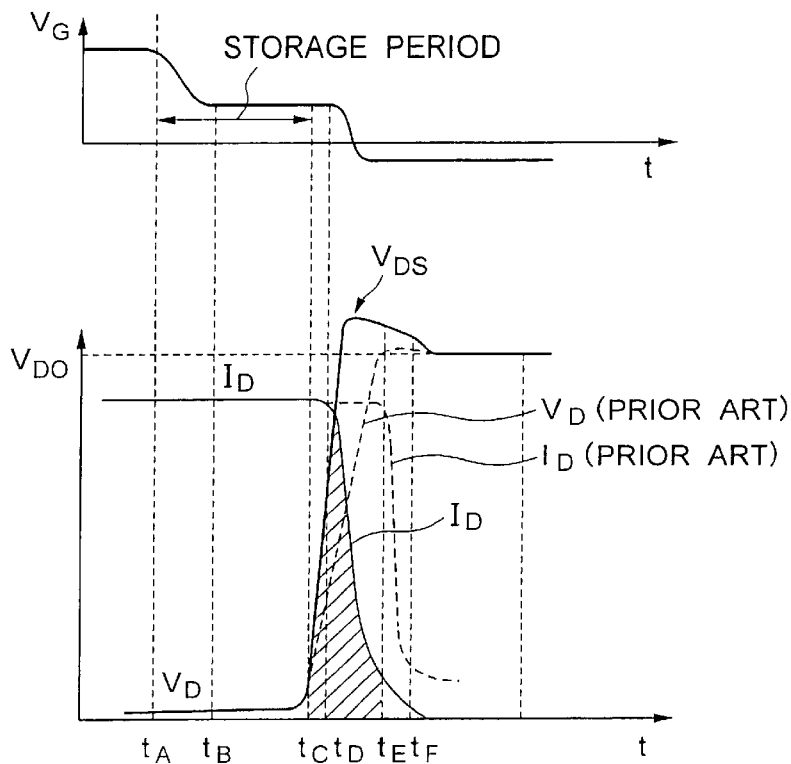
FIG. 2 is a graph shows changes of the current and voltage characteristics of L-loaded IGBT 30 in response to time during turnoff period.

FIG. 2 shows a graph of changes of the current-voltage characteristics of L-loaded IGBT 30 in response to time during turnoff period. For easier understanding, the gate voltage $V_G$ is shown by a separate graph using the common time base.

FIGS. 3 to 6 show carrier profiles of IGBT 30 from time $t_A$ to time $t_D$ by way of graphs taking the depth from the top surface of the source layer 15 to the drain layer 31 on the abscissa and taking the carrier concentration on the ordinate. For clearly showing difference between IGBT according to the instant embodiment and prior art IGBTS, excess carrier profile in the n-type base layer 21 in a prior art punch-through IGBT is shown by the broken line.

First, the IGBT 30 is turned OFF (time $T_A$).

Figure 3:
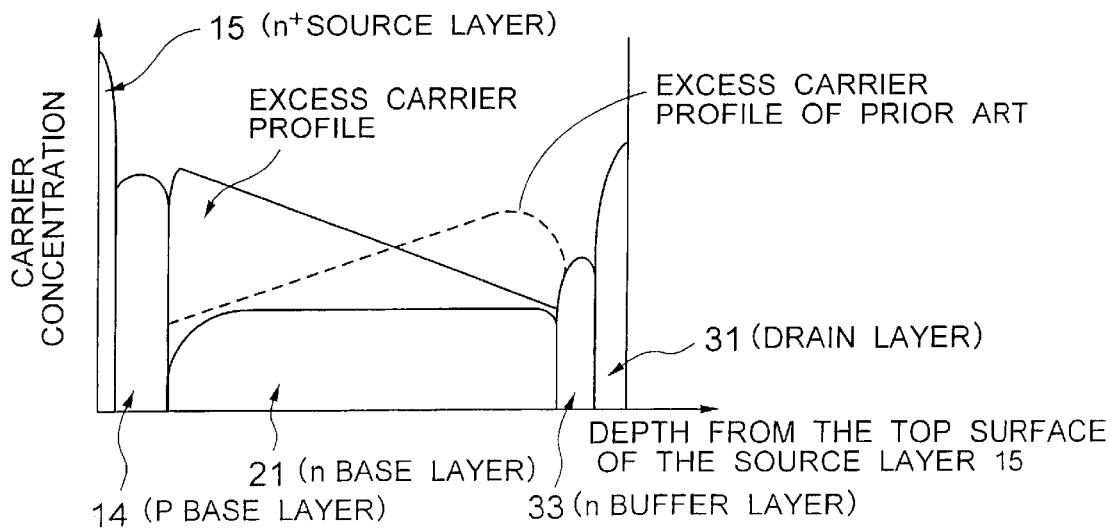
FIG. 3 is a graph shows a carrier profile of IGBT 30 at time $t_A$.

FIG. 3 shows the carrier profile of IGBT 30 at time $t_A$. In the IGBT 30 according to the instant embodiment, the excess carrier profile in the n-type base layer 21 decreases from near the p-type base layer 14 toward the drain layer 31.

This is because the hole current from the drain is relatively small, and the injection efficiency of the hole current is as low as 0.27, and therefore, the excess carriers of the n-type base layer 21 decreases from near the p-type base layer 14 toward the drain layer 31.

When the injection efficiency of the p-layer of the drain is 0.27, the excess carrier profile becomes substantially parallel to the abscissa. That is, excess carriers of the n-type base layer 21 distributes substantially equally from the top surface of the source layer 15 in the depthwise direction.

After that, the gate voltage $V_G$ gradually decreases, and accordingly, the electron current flowing in the channel formed in the p-type base layer 14 decreases (time $t_B$).

Figure 4:
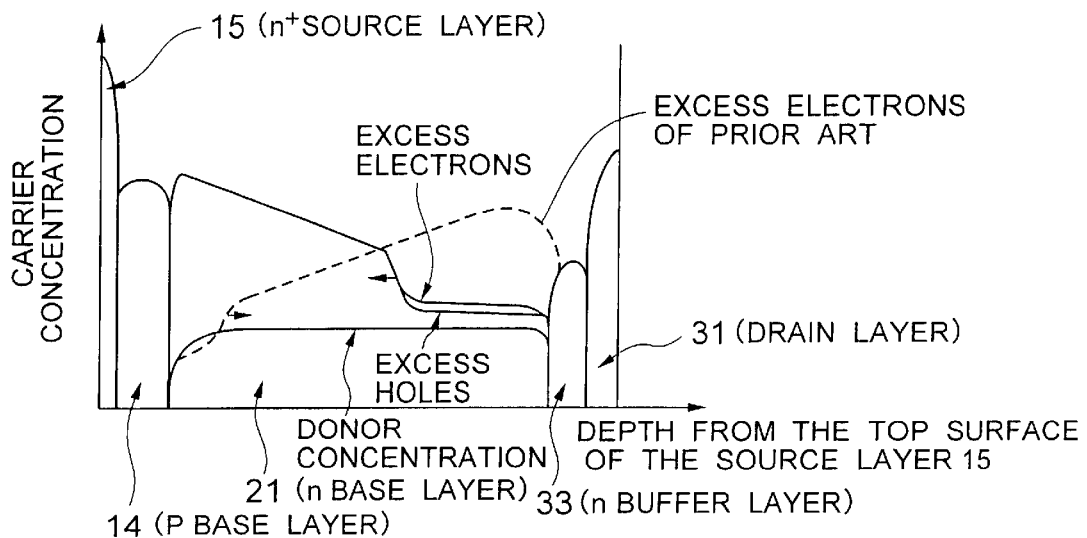
FIG. 4 is a graph shows a carrier profile of IGBT 30 at time $t_B$.

FIG. 4 shows a graph of carrier profile of IGBT 30 at time $t_B$. Since the electron current flowing in the channel decreases, electrons heretofore accumulated in the n-type base layer 21 is supplied. This is because the L load between the anode and the cathode of IGBT 30 works to maintain the drain current $I_D$.

Here is defined the storage period. Assuming the drain voltage is $V_{D0}$ when IGBT is OFF, the storage period indicates the period from the point of time $t_A$ where IGBT 30 is turned OFF to the point of time $t_C$ where the drain voltage $V_D$ rises to $0.1*V_{D0}$.

In the prior art IGBT in which the injection efficiency of hole current is larger than 0.5, when the channel electron current decreases, a quantity of excess electrons existing near the p-type base layer 14 among excess electrons accumulated in the n-type base layer 21 is supplemented from time to time. Therefore, the depletion layer expands between the p-type base layer 14 and the n-type base layer 21, and the drain voltage starts rising. That is, in the prior art IGBT, almost all of excess carriers are discharged from the n-type base layer 21 after the storage period (from time $t_C$ to time $t_E$). Thus the tail current is relatively large in the prior art IGBT.

In contrast, according to the instant embodiment of the invention, since the injection efficiency of the hole current is 0.27 or lower, excess electrons accumulated in the n-type base layer 21 are supplemented from time to time from those existing near the n-type buffer layer 33. Therefore, before the depletion layer is produced between the p-type base layer 14 and the n-type base layer 21, excess carriers heretofore accumulated in the n-type base layer 21 are discharged.

In other words, almost all of excess carriers are discharged from the n-type base layer 21 in the storage period. Therefore, after the storage period (from time $t_C$ to time $t_E$), almost all of excess carriers are already discharged from the n-type base layer 21. As a result, the drain voltage $V_D$ rises quicker. Thus the tail current is relatively small in the IGBT 30 according to the instant embodiment (see FIG. 2).

The injection efficiency of the drain layer 31 is limited not to exceed 0.27, taking account of the mobility $\mu_h$ of holes and mobility $\mu_e$ of electrons under a low electric field. That is, since $\mu_h:\mu_e=0.27:0.73$, excess carriers can be removed from the n-type base layer 21 without excess hole current injected from the anode into the n-type base layer 21. Therefore, excess carriers decrease in the n-type base layer 21 while the inclination of the excess carrier profiles shown in FIGS. 3 and 4 are maintained. As a result, excess carriers as many as possible are discharged from the n-type base layer 21 during the storage period.

When excess carriers in the n-type base layer 21 are removed substantially entirely after the storage period, the drain voltage $V_D$ begins to rise. That is, the depletion layer begins to spread between the p-type base layer 14 and the n-type base layer 21 (time $t_C$).

Figure 5:
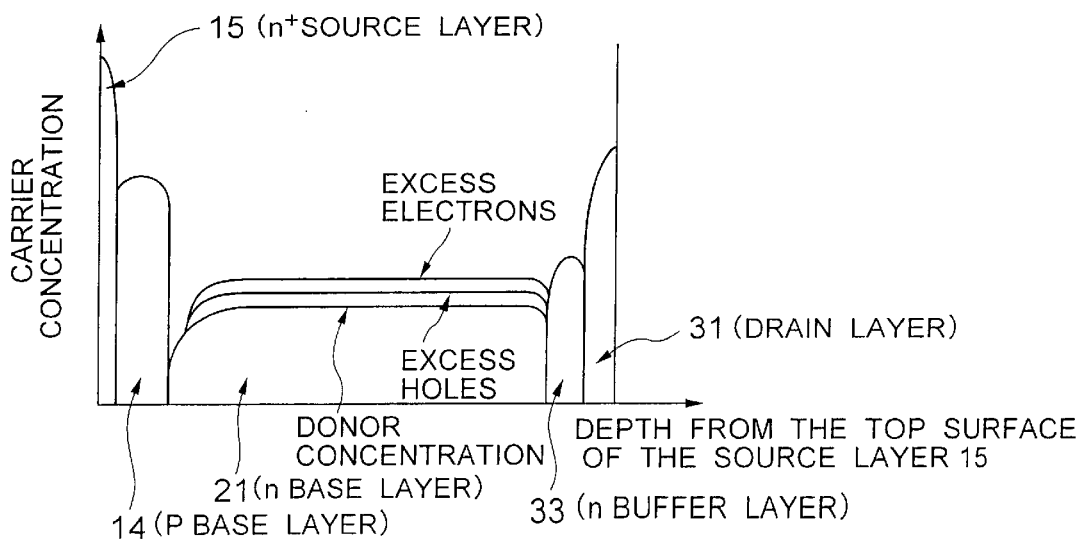
FIG. 5 is a graph shows a carrier profile of IGBT 30 at time $t_C$.

FIG. 5 shows a carrier profile of IGBT 30 at time $t_C$. Certain quantities of excess electrons and excess holes in proportion to the mobility $\mu_h$ and mobility $\mu_e$ remain respectively.

Thereafter, when the depletion layer spreads between the p-type base layer 14 and the n-type base layer 21, the drain voltage $V_D$ rises rapidly (time $t_D$).

Figure 6:
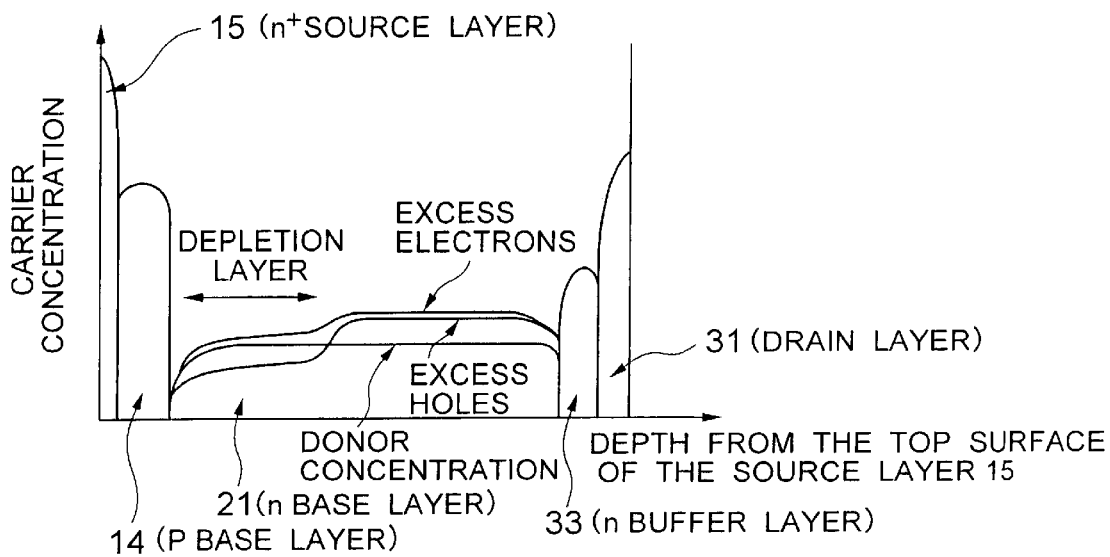
FIG. 6 is a graph shows a carrier profile of IGBT 30 at time $t_D$.

FIG. 6 shows a carrier profile of IGBT 30 at time $t_D$.

In the prior art IGBT, excess carriers accumulated in the n-type base layer 21 disappear as the depletion layer spreads between the p-type base layer 14 and the n-type base layer 21. Therefore, the drain voltage $V_D$ rises with the electric field applied to the depletion layer, and the excess carriers in the n-type base layer 21 decreases while the drain voltage $V_D$ rises. That is, as explained above, in the prior art IGBT, excess carriers in the n-type base layer 21 are discharged therefrom after the storage period.

In contrast, in the instant embodiment, almost all of excess carriers are already discharged from the n-type base layer 21 in the storage period as shown in FIG. 6. Therefore, the depletion layer between the p-type base layer 14 and the n-type base layer 21 expands rapidly, and the drain voltage $V_D$ rises quicker that the prior art.

In FIG. 2, inclination of the drain voltage $V_D$ of the IGBT 30 according to the instant embodiment is larger than that of the prior art IGBT. The shaded region of FIG. 2 indicates the power loss, i.e. switching loss, of the IGBT 30 according to the instant embodiment upon turnoff. Drain voltage $V_D$ and drain current $I_D$ of prior art is shown by broken lines in the FIG. 2.

Since the inclination of the drain voltage $V_D$ of IGBT 30 is relatively large and the tail current is small, the switching loss of IGBT 30 is smaller than that of the prior art IGBT.

Furthermore, according to the instant embodiment, impurity concentration ratio between the p-type drain layer 31 and the n-type buffer layer 33 is adjusted to control the injection ratio of the hole current from the anode. Therefore, the n-type base layer does not need to be changed either in impurity concentration or thickness. As a result, the ON voltage and the ON resistance can be maintained low.

In the instant embodiment, the point of time $t_E$ is the end point of the fall time. The end point of the fall time of the conventional IGBT is $t_F$. It is therefore appreciated that the IGBT 30 according to the instant embodiment has a smaller switching loss and a shorter turnoff time. Thus the IGBT 30 has a quicker switching speed.

After the point of time $t_D$, when the depletion layer fully expands in the b-type base layer 21, then, the drain current $I_D$ decreases. While the depletion layer expands, excess carriers gradually disappear from the n-type base layer 21. However, concentration of the accumulated electrons in the depletion layer of the n-type base layer 21 becomes larger than the concentration of the accumulated holes therein. Therefore, the total density of the electric charge in the depletion layer, i.e. in the high electric field, becomes lower than the donor concentration. As a result, the drain voltage $V_D$ becomes higher than the static breakdown voltage of IGBT 30. The static breakdown voltage is the breakdown voltage that the element exhibits when the drain current $I_D$ is substantially zero. When the depletion layer expands to the entire region of the n-type base layer and the drain current $I_D$ decreases, the concentration of electric charge in the n-type base returns to the donor concentration. Therefore, breakdown voltage of IGBT 30 returns to the static breakdown voltage.

That is, the spike voltage $V_{DS}$ of IGBT after the turnoff of IGBT 30 (see FIG. 2) is high when the drain voltage $V_D$ starts rising, and thereafter decreases gradually.

Still thereafter, because the clamp diode, etc. connected in parallel to the L load become conductive, the drain voltage $V_D$ is maintained at the voltage $V_{D0}$.

Figure 7:
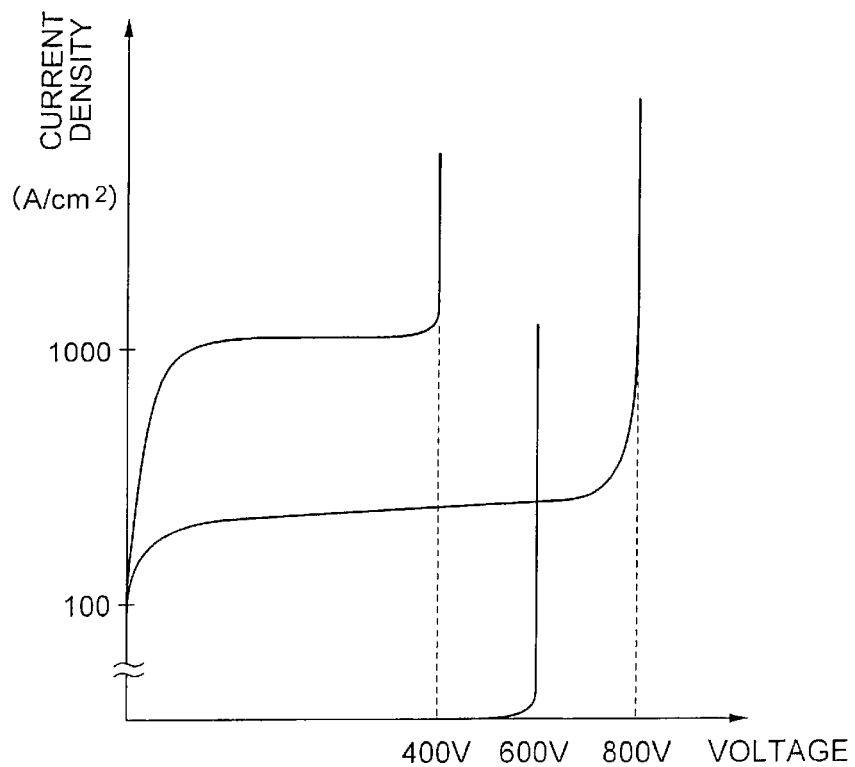
FIG. 7 is a graph shows V-I characteristics of 600V-resistant IGBT 30.

FIG. 7 is a graph of V-I characteristics of 600V-resistant IGBT 30 taken as IGBT according to the instant embodiment. The graph of FIG. 7 shows the voltage applied across the anode and the cathode of IGBT 30 on the abscissa, and the current density of the current flowing between the anode and the cathode of IGBT 30 on the ordinate. Breakdown voltage of the prior art 600V-resistant IGBT decreases as the current density increases (not shown).

IGBT 30 according to the instant embodiment, however, once increases in resistant to voltage as the current density increases, and decreases when the current density further increases.

Explained below is a reason why IGBT 30 exhibits such characteristics.

IGBT 30 is so configured that the injection efficiency of hole current from the anode is 0.27 or less. Under a low electric field, ratio between the mobility $\mu_h$ of holes and mobility $\mu_e$ of electrons is $\mu_h:\mu_e=0.27:0.73$. On the other hand, under a high electric field, ratio of the saturation velocity $v_h$ of holes and the saturation velocity $v_e$ of electrons is $v_h:v_e=9:10$. Since the injection efficiency of hole current in IGBT 30 is 0.27 or less, electron current in the n-type base layer 21 near the p-type base layer 14 becomes excessive.

When the electric charge density in the n-type base is z, the following equation is established.

$$z=N_D-Jn/(q*Vn)+Jp/(q*Vp) \tag{1}$$

where $N_D$ is the donor concentration in the n-type base layer 21; Jn is the electron current density; Jp is the hole current density; Vn is the saturation velocity of electrons in a high electric field; Vp is the saturation velocity of holes in a high electric field; and q is the elementary electric charge.

In a high electric field, Vn:Vp=9:10. Jn and Jp depend upon the injection efficiency of hole current from the anode. Therefore, $Jp/(Jn+Jp)=Y \leq 0.27$. Y indicates the injection efficiency.

Therefore, from Vn:Vp=9:10, $Jp/(Jn+Jp)=Y \leq 0.27$ and Equation 1, the electric current density z decreases from the donor concentration $N_D$ as the current density increases.

As a result, the impurity concentration of the n-type base layer 21 near the p-type base layer 14 decreases in the apparent value. Thereby, the breakdown voltage between the p-type base layer 14 and the n-type base layer 21 increases.

On the other hand, when the current density of the current flowing in the IGBT 30 further increases, the electric charge density z may become negative. Thereby, the n-type base layer 21 near the p-type base layer 14 becomes apparently p-type. Thus the p-type base layer 14 and the n-type base layer 21 apparently become equal in conduction type. Therefore, breakdown voltage between the p-type base layer 14 and the n-type base layer 21 decreases.

That is, when the current density increases, breakdown voltage between the p-type base layer 14 and the n-type base layer 21 increases until the electric charge density z becomes zero, and decreases when the electric charge density becomes negative.

These characteristics can be obtained subject to the injection efficiency of hole current from the anode being less than 9/19. Ratio between saturation velocitys of holes and electrons under a high electric field is Vn:Vp=9:10. Therefore, as long as the injection efficiency of hole current from the anode is less than 9/19, the electric charge density z in Equation 1 decreases along with an increase of the electric charge density.

With these characteristics, IGBT 30 can exhibit breakdown voltage in excess of the static breakdown voltage, 600V, while maintaining that thickness and impurity concentration of the n-type base layer 13.

The condition that the injection efficiency of hole current from the anode is less than 9/19 is equivalent to that $V_{SUS}$ is larger than the static breakdown voltage of IGBT 30. $V_{SUS}$ is the voltage transiently applied to the element which is connected to an appropriate inductance load between 1 $\mu$H to 1 mH without using a protective circuit when the rated current is turned off. This inductance load may include an L load inserted by back-to-back connection of a ring-current diode and a resistor, etc. in serial connection in addition to the L load from 1 µH to 1 mH.

FIG. 8 is a cross-sectional view of non-punch-through IGBT 40 taken as an insulated gate semiconductor device according to the second embodiment of the invention. IGBT 40 is different from the first embodiment in not including the n-type buffer layer.

Therefore, in IGBT 40, the same effect as that of the first embodiment can be obtained by controlling the ratio between the impurity concentration of the n$^-$-type base layer 45 and the impurity concentration of the p$^+$-type drain layer 46.

In greater detail, the total impurity dose of the p$^+$-type drain layer 46 is limited not to exceed $5 \times 10^{13}$ cm$^{-2}$. It is thereby possible to reduce the switching loss upon turnoff while maintaining the ON resistance low.

Additionally, when the injection efficiency of the drain layer is adjusted to be less than 9/19 and the current density increases, IGBT 40 can ensure a breakdown voltage not lower than the static breakdown voltage while the n-type base layer 45 is maintained to be thin and low in impurity concentration.

FIG. 9 is a cross-sectional view of punch-through IGBT 50 taken as an insulated gate semiconductor device according to the third embodiment of the invention. IGBT 50 is different from the first embodiment in including a plurality of n-type buffer layers 51, 53 different in impurity concentration from each other.

Therefore, in IGBT 50, the same effect as that of the first embodiment can be obtained by controlling the ratio between the impurity concentration of the n$^+$-type buffer layer 51 and the impurity concentration of the p$^+$-type drain layer 52.

In greater detail, the total impurity dose of the p$^+$-type drain layer is limited not to exceed $5 \times 10^{13}$ cm$^{-2}$. It is thereby possible to reduce the switching loss upon turnoff while maintaining the ON resistance low.

Additionally, with an increase of the current density, IGBT 50 ensures a breakdown voltage not lower than the static breakdown voltage while maintaining the n-type base layer 54 thin and low in impurity concentration.

IGBT 50, having a plurality of n-type buffer layers 51, 53 different in impurity concentration, ensures the following effects.

When IGBT 50 turns off, the depletion layer spreading from the base layer 14 is prevented from stopping rapidly. Therefore, the drain current density moderately decreases upon turnoff. This contributes to relaxing the spike voltage and preventing the drain current or drain voltage from oscillation.

If the n-type buffer layer 51 is not formed, IGBT will not be able to maintain the breakdown voltage upon application of a high-voltage reverse bias. Usually, therefore, the n-type buffer layer 53 is thickened to ensure the breakdown voltage. This method, however, results in increasing the total thickness of the substrate and inevitably invites an increase of the ON voltage.

Taking it into consideration, the use of a plurality of n-type buffer layers 51, 53 different in impurity concentration successfully ensures a sufficient breakdown voltage upon application of a reverse bias.

The n-type buffer layer 53 is preferably adjusted to gradually spread the depletion layer in response to the applied voltage. That is, the n-type buffer layer 53 is preferably formed such that the depletion layer spreads therein to a level capable of maintaining the breakdown voltage of the element but does not reach the high-concentrated n$^+$-type buffer layer 51 so as to prevent the drain current or drain voltage from oscillation.

IGBT according to any of the first to third embodiments of the invention can be manufactured by the method described in Japanese Patent Application No. 2001-054945.

The effects of the invention can be similarly obtained even when the p-type and n-type conduction types are replaced.

As described above, the insulated gate semiconductor device according to any embodiment of the invention can reduce the switching loss upon turnoff while maintaining a low ON resistance.

Additionally, the insulated gate semiconductor device according to any embodiment of the invention can be enhanced in breakdown voltage while maintaining the n$^-$-type base layer sufficiently thin.

What is claimed is:

1. An insulated gate semiconductor device comprising:
    a first base layer of a first conduction type;
    a second base layer of a second conduction type formed on a first surface of the first base layer;
    a source layer of the first conduction type selectively formed in a surface region of the second base layer;
    a drain layer of the second conduction type formed on a second surface of the first base layer opposite from said first surface; and
    a gate electrode insulated from the source layer, the first base layer and the second base layer and forming in the second base layer a channel electrically connecting between the source layer and the first base layer,
    wherein the injection efficiency of hole current from said drain layer is 0.27 in maximum.

2. The insulated gate semiconductor device according to claim 1, wherein a thickness of the first base layer is 70 µm in maximum.

3. An insulated gate semiconductor device comprising:
    a first base layer of a first conduction type;
    a second base layer of a second conduction type formed on a first surface of the first base layer;
    a source layer of the first conduction type selectively formed in a surface region of the second base layer;
    a drain layer of the second conduction type formed on a second surface of the first base layer opposite from said first surface; and
    a gate electrode insulated from the source layer, the first base layer and the second base layer and forming in the second base layer a channel electrically connecting between the source layer and the first base layer,
    wherein the voltage transiently applied to said device is larger than the static breakdown voltage between the source and the drain when a rated current is turned off under a condition, in which condition an inductance load is from 1 µH to 1µH and said device is connected to said inductance load without using a protective circuit, and wherein a thickness of the first base layer is 70 µm in maximum.

4. An insulated gate semiconductor device comprising:
    a first base layer of a first conduction type;
    a second base layer of a second conduction type formed on a first surface of the first base layer;
    a source layer of the first conduction type selectively formed in a surface region of the second base layer;
    a drain layer of the second conduction type formed on a second surface of the first base layer opposite from said first surface; and a gate electrode insulated from the source layer, the first base layer and the second base layer and forming in the second base layer a channel electrically connecting the source layer and the first base layer, wherein the injection efficiency of hole current from the drain layer is less than 9/19.

5. The insulated gate semiconductor device according to claim 4, wherein a thickness of the first base layer is 70 µm in maximum.

6. An insulated gate semiconductor device comprising:
a first base layer of a first conduction type;
a second base layer of a second conduction type formed on a first surface of the first base layer;
a source layer of the first conduction type selectively formed in a surface region of the second base layer;
a drain layer of the second conduction type formed on a second surface of the first base layer opposite from said first surface and said drain layer having a thickness not larger than 0.5 µm; and
a gate electrode insulated from the source layer, the first base layer and the second base layer and forming in the second base layer a channel electrically connecting the source layer and the first base layer, wherein the voltage transiently applied to said device is larger than the static breakdown voltage between the source and the drain when a rated current is turned off under a condition, in which condition an inductance load is from 1 µH to 1mH and said device is connected to said inductance load without using a protective circuit, and wherein a thickness of the first base layer is 70 µm in maximum.

7. The insulated gate semiconductor device according to claim 1 further comprising:
a buffer layer of the first conduction type which is lower in resistance value than the first base layer and which is located between the first base layer and the drain layer.

8. The insulated gate semiconductor device according to claim 3 further comprising:
a buffer layer of the first conduction type which is lower in resistance value than the first base layer and which is located between the first base layer and the drain layer.

9. The insulated gate semiconductor device according to claim 4 further comprising:
a buffer layer of the first conduction type which is lower in resistance value than the first base layer and which is located between the first base layer and the drain layer.

10. The insulated gate semiconductor device according to claim 6 further comprising:
a buffer layer of the first conduction type which is lower in resistance value than the first base layer and which is located between the first base layer and the drain layer.

11. The insulated gate semiconductor device according to claim 7, wherein the buffer layer of the first conduction type includes a plurality of layers different in resistance value from each other.

12. The insulated gate semiconductor device according to claim 8, wherein the buffer layer of the first conduction type includes a plurality of layers different in resistance value from each other.

13. The insulated gate semiconductor device according to claim 9, wherein the buffer layer of the first conduction type includes a plurality of layers different in resistance value from each other.

14. The insulated gate semiconductor device according to claim 10, wherein the buffer layer of the first conduction type includes a plurality of layers different in resistance value from each other.

15. The insulated gate semiconductor device according to claim 7, wherein the buffer layer of the first conduction type includes two stepwise layers having a low concentration and a high concentration respectively.

16. The insulated gate semiconductor device according to claim 8, wherein the buffer layer of the first conduction type includes two stepwise layers having a low concentration and a high concentration respectively.

17. The insulated gate semiconductor device according to claim 9, wherein the buffer layer of the first conduction type includes two stepwise layers having a low concentration and a high concentration respectively.

18. The insulated gate semiconductor device according to claim 10, wherein the buffer layer of the first conduction type includes two stepwise layers having a low concentration and a high concentration respectively.

19. An insulated gate semiconductor device according to claim 1, wherein the total impurity dose of the drain layer is $5 \times 10^{13}$ cm$^{-2}$ in maximum.

20. The insulated gate semiconductor device according to claim 19, wherein a thickness of the drain layer is 0.5 µm in maximum.

* * * * *